(12) United States Patent
Taylor et al.

(10) Patent No.: US 8,603,315 B2
(45) Date of Patent: Dec. 10, 2013

(54) TIN AND TIN ALLOY ELECTROPLATING METHOD WITH CONTROLLED INTERNAL STRESS AND GRAIN SIZE OF THE RESULTING DEPOSIT

(75) Inventors: E. Jennings Taylor, Troy, OH (US); Jenny J. Sun, St. Joseph, MI (US)

(73) Assignee: Faraday Technology, Inc., Clayton, OH (US)

( * ) Notice: Subject to any disclaimer, the term of this patent is extended or adjusted under 35 U.S.C. 154(b) by 586 days.

(21) Appl. No.: 11/620,079

(22) Filed: Jan. 5, 2007

(65) Prior Publication Data

US 2007/0158204 A1 Jul. 12, 2007

Related U.S. Application Data

(60) Provisional application No. 60/756,634, filed on Jan. 6, 2006.

(51) Int. Cl.
*C25D 5/18* (2006.01)

(52) U.S. Cl.
USPC ........... 205/104; 205/241; 205/254; 205/303; 205/304

(58) Field of Classification Search
USPC .......... 205/104, 109, 241, 252–254, 300–304
See application file for complete search history.

(56) References Cited

U.S. PATENT DOCUMENTS

| | | | |
|---|---|---|---|
| 5,269,453 A * | 12/1993 | Melton et al. | 228/180.22 |
| 5,750,017 A | 5/1998 | Zhang | |
| 6,080,504 A | 6/2000 | Taylor et al. | |
| 6,267,863 B1 | 7/2001 | Abys et al. | |
| 6,342,148 B1 | 1/2002 | Chiu et al. | |
| 6,524,461 B2 | 2/2003 | Taylor et al. | |
| 6,652,727 B2 | 11/2003 | Taylor et al. | |
| 2002/0011414 A1 * | 1/2002 | Bank et al. | 205/95 |
| 2002/0038764 A1 * | 4/2002 | Taylor et al. | 205/103 |
| 2002/0038765 A1 * | 4/2002 | Fitter | 205/302 |
| 2003/0133231 A1 | 7/2003 | Nikitin et al. | |
| 2003/0134142 A1 | 7/2003 | Ivey et al. | |
| 2004/0256239 A1 * | 12/2004 | Whitlaw et al. | 205/118 |
| 2005/0205429 A1 | 9/2005 | Gebhart et al. | |
| 2005/0249967 A1 | 11/2005 | Egli | |

OTHER PUBLICATIONS

Osterman, M., "Mitigation Strategies for Tin Whiskers," http://www.calce.umd.edu/lead-free/tin-whiskers/TINWHISKERMITIGATION.pdf (2002).

Jordan, M., "Lead-Free Tin Alloys—Laboratory Curiosities or Capable Processes?" Metal Finishing 101, 1, pp. 8-16 (2003).

Zhang, Y. et al., "An Alternative Surface Finish for Tin/Lead Solders—Pure Tin," Proceedings of SUR/FIN '96, AESF, pp. 223-246 (1996).

Hilty, R.D., "Lead-free Platings for Connector Contacts," Connector Specifier (2001).

Schetty, R., "Tin Whisker Studies—Experimentation & Mechanistic Understanding," Plating & Surface Finishing, 90, 3, pp. 48-51 (Mar. 2003).

(Continued)

*Primary Examiner* — Susan D Leong (74) *Attorney, Agent, or Firm* — Thompson Hine L.L.P.

(57) ABSTRACT

A method for electrochemically plating tin or tin alloy onto a workpiece to provide a tin or tin alloy deposit on said workpiece having a stress differential and workpieces characterized by a tin or tin alloy deposit having a stress differential.

27 Claims, 3 Drawing Sheets

(56) References Cited

OTHER PUBLICATIONS

Knodler, A., Theory and Practice of Pulse Plating, AESF, Orlando, Florida, pp. 119-175 (1986).
Huang, C-H. et al., "Pulsed Deposition of Ultra-thin Copper Foils," Plating & Surface Finsihing, pp. 34-38 (Sep. 2004).
Lee, B-Z. et al., "Spontaneous Grown Mechanism of Tin Whiskers," Acta. Mater., vol. 46, No. 10, pp. 3701-3714 (1998).
Zhang, Y. et al., "A unique electroplating tin chemistry," Circuit World, 25/1, pp. 30-37 (1998).
PCT, International Preliminary Report on Patentability issued regarding International Application No. PCT/US2007/060027 (Jul. 17, 2008).

* cited by examiner

TIN AND TIN ALLOY ELECTROPLATING METHOD WITH CONTROLLED INTERNAL STRESS AND GRAIN SIZE OF THE RESULTING DEPOSIT

CROSS REFERENCE TO RELATED APPLICATIONS

The present application claims priority of U.S. Provisional Application No. 60/756,634 filed Jan. 6, 2006.

FIELD OF THE INVENTION

The present invention relates to a method and apparatus for deposition of tin or tin alloy on a workpiece such as a semiconductor wafer, wafer level package, chip scale package or printed circuit board.

BACKGROUND OF THE INVENTION

A tin or tin alloy plating process for surface finish or solder applications that does not contain lead is desired by the electronics industry due to environmental considerations. However, lead-free tin or tin alloy solders deposited using electrochemical techniques have shown a tendency to grow whiskers. These whiskers can cause short-circuiting, resulting in poor reliability and failure of the electronics component. A number of theories have been postulated as to the cause of the whisker growth and detrimental solder performance. The three main causes proposed are internal stresses, grain size, and organic additives.

Recent studies have also suggested that the occurrence of whiskers in pure tin deposits can be reduced by the deposition of matte finish tin, rather than bright tin. Consequently, it has been suggested that plating bath additives that make the plating deposit bright and shiny have a tendency to add internal stress and promote whisker growth. Deposition of matte tin can be achieved using plating baths with low additive concentrations, however, to achieve the required current distribution, and therefore metal distribution, as well as desired grain size, organic additives must be added to the plating bath. These additives can break down, become incorporated into the deposit, promote whisker growth, and degrade the long-term performance of the solder.

The use of pulse plating as compared to direct current plating, for control of mechanical properties of plated deposits has been previously discussed by Knodler, who measured the mechanical properties of pulsed and direct current plated gold alloy deposits, and stated that "direct current deposits are known to be highly stressed". Knolder showed that through the use of pulse plating, the stresses in a gold alloy deposit could be reduced, as compared to deposits from direct current plating. In addition, the decrease in stress was accompanied by a loss of brightness. Huang et. al demonstrated that internal tensile stresses in 5 micrometer-thick copper foil, electrodeposited from a copper-sulfuric acid bath containing gelatin, could be reduced by the use of forward pulse currents.

Organic additives for tin and tin alloy plating baths have been previously described and are generally incorporated in plating baths to control the grain size in the desired 1 to 8 micrometer range. These additives, while maintaining the required grain size, can increase the chance of whisker growth. Furthermore, the inclusion of organic additives in the bath requires the use of complex and often expensive equipment to control the additive concentration, and to minimize the breakdown of the additives and their incorporation into the deposit. Zhang has demonstrated that in the presence of a grain refiner and a wetting agent, a grain size of 2 to 8 micrometers in a tin deposit can be obtained using a pulse current waveform. However, the grain refiner breaks down over time and must be replenished on a regular basis. Furthermore, the effect of this plating process on the internal stresses in the deposit is unknown.

Internal stresses are present in pure tin deposits after plating as described in the prior art. As the tin deposit ages, the stresses relax and single tin crystals, or whiskers, nucleate out from the surface. These whiskers can grow to lengths of greater than 100 micrometers. To release the stresses without whisker growth, manufacturers remelt the tin deposits. However, this process causes problems with corrosion or poor solderability.

To minimize whisker growth in the solder, lead-free tin alloys such as tin-copper, tin-bismuth, and tin-silver have been proposed. While these alloys may reduce the occurrence of whiskers, there are problems associated with bath stability and bath control, which prohibit these processes from being used commercially. The deposition potentials of these three alloying elements are more noble than that of tin. This causes problems with preferential deposition of the alloying elements, variations in alloy composition, immersion plating of the alloy on the tin anodes and redox reactions between the tin and the alloying elements. To overcome these problems, complexing agents and stabilizers must be added to the bath, or the concentration of the alloying elements must be maintained at very low levels, making control difficult and expensive.

SUMMARY OF THE INVENTION

The present invention relates to a method for depositing tin or tin alloy on a workpiece using an electrochemical plating process, wherein the metal deposit properties are controlled to prevent deleterious whisker growth during service, to obtain a desired geometric solder bump and finishing qualities, such as matte finish appearance, controlled grain size, and controllable internal stresses. Control of deposit properties is a product of the manipulation of the electrodynamics at the workpiece. In one embodiment, the method is conducted without using deleterious organic plating additives.

One embodiment of the present invention more particularly relates to controlling the electrodynamics at the workpiece, to facilitate deposition of a tin or tin alloy with a stress differential using an electrochemical plating process. The term "stress differential" is used herein to refer a stress difference within the coating or deposit. In one embodiment the stress differential may be a stress gradient from a compressive state at the interface to a less compressive, zero, or tensile state at the coating surface or from a tensile state at the interface to a less tensile, zero, or compressive state at the coating surface, or from a zero state at the interface to a tensile or a compressive state at the coating surface.

In another the stress profile within the coating changes in an alternating manner to either a compressive state, a tensile state or a zero state, a number of times through the thickness of the coating.

Another embodiment of the present invention more particularly relates to controlling the electrodynamics at the workpiece, to facilitate deposition of a tin or tin alloy with controlled grain size using an electrochemical plating process.

Still another embodiment of the present invention more particularly relates to controlling the electrodynamics at the workpiece, to facilitate deposition of a tin or tin alloy with a matte finish using an electrochemical plating process.

Another embodiment of the present invention more particularly relates to controlling the electrodynamics at the workpiece, to facilitate deposition of a tin or tin alloy without the use of organic additives using an electrochemical plating process.

DETAILED DESCRIPTION OF PREFERRED EMBODIMENTS

In the following detailed description, reference is made to the accompanying drawings which form a part hereof, and in which are illustrated specific embodiments in which the invention may be practiced.

Those skilled in the art will recognize that the invention is not limited to the specific embodiments illustrated in these drawings.

The present invention provides a method for depositing tin or tin alloy for the fabrication of electronic devices, including but not limited to semiconductor wafers, wafer level packages, chip scale packages, and printed circuit boards. The electrically mediated process for the deposition of pure tin in the present invention, results in a deposit with grain sizes in the range of about 1 to 8 micrometers. The deposit may include up to 30% grains having a grain size outside this range but the average grain size should be within this range. While the patent is not bound by theory, it is believed that control of deposit stress properties is a product of the manipulation of the electrodynamic condition at the workpiece. In certain embodiments this will allow the deposition of whisker-free tin or tin alloy deposits to be quickly and cost-effectively fabricated in a manufacturing process, and implemented as a drop-in replacement for the current lead-tin solder practice. The term "whisker-free" when used herein includes deposits that are free of whiskers during the service life of the electronic component, such that failure due to whisker growth does not occur.

The method of the invention can be carried out using any suitable electrolytic deposition apparatus, for example the apparatus described in U.S. patent application Ser. No. 10/804,841 filed 19 Mar. 2004. That apparatus includes a vessel, which houses a counterelectrode, which can be formed from any suitable electrode material such as a soluble tin or tin alloy or insoluble titanium or platinum. In practice, the number of electrodes will be selected to facilitate achieving a uniform deposition across the workpiece. The wafer or other substrate to be treated is clamped in the vessel using a chuck in a position in which it is located opposite the counterelectrode(s). A drive mechanism may be provided to rotate and oscillate the workpiece during the electroplating process. The vessel includes an inlet for a supply of electrolyte, which is pumped into and out of the vessel as described in more detail in the published application using any convenient pump. Liquid mass flow controllers deliver the electrolyte at flow rates, which are adjusted for the volume of the section.

The method of the invention can be carried out in a suitable electrolyte, for example, but not limited to, an electrolyte of 70% methane sulfonic acid at a concentration of 240 milliliters per liter, stannous sulfonate at a concentration that gives approximately 37 grams per liter of tin, and a wetting agent such as Triton X-100® at a concentration of approximately 300 ppm. This electroplating bath is devoid of difficult-to-control additives and is easy to maintain. In one embodiment of the invention such additives are expressly excluded. In a more particular embodiment organic additives having heterocyclic groups are excluded from the plating bath. Need to distinguish permitted additives like Triton from those that are not permitted.

Figure 1:
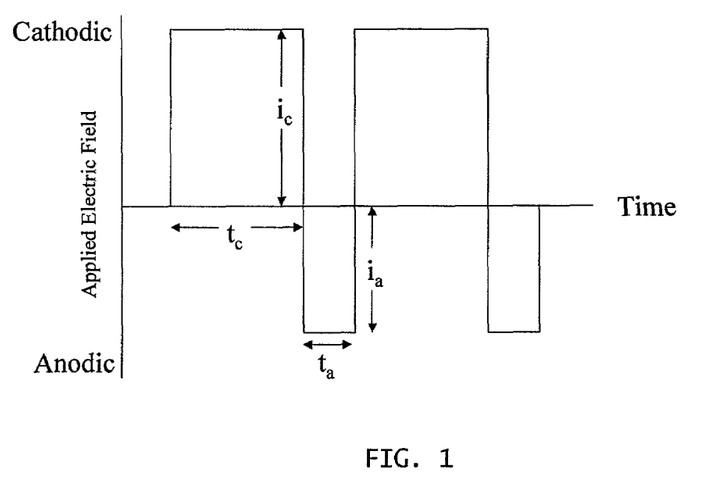
FIG. 1 is a schematic illustration of an electrically mediated waveform.

Fundamentally, the electrically mediated process of the present invention enhances the control of mass transport and current (and therefore metal) distribution, allowing for control of grain size and control of the type and magnitude of internal stresses in the tin or tin alloy deposit. The process is based upon an electrically mediated waveform (FIG. 1), which consists of a cathodic pulse current density, $i_c$, a cathodic on-time, $t_c$, an anodic pulse current density, $i_a$, an anodic on-time, $t_a$, and an off-time, $t_0$. Although no off-time is shown in FIG. 1, and off-time can be included, and said Fig. is not limited by such. The sum of the cathodic and anodic on-times and the off-time is the period, T, of the electrically mediated waveform and the inverse of the period is the frequency, f. The cathodic, $\gamma_c$, and anodic, $\gamma_a$, duty cycles are the ratios of the respective on-times to the period. The average current density or net electrodeposition rate is given by:

$$\text{Electrodeposition rate} = i_c \gamma_c - i_a \gamma_a \quad (1)$$

The use of electrically mediated waveforms to control the current distribution, and therefore metal distribution, without the use of organic additives in electrodeposition of metal features onto semiconductor wafer or printed circuit board applications has been previously explained in U.S. Pat. No. 6,652,727 issued Nov. 25, 2003 and U.S. Pat. No. 6,524,461 issued Feb. 25, 2003.

The use of electrically mediated waveforms to control the nucleation and growth of grains during electrodeposition, to control grain size in this invention, has previously been discussed in U.S. Pat. No. 6,080,504.

In the present invention, examples of suitable electrically mediated waveform parameters are a cathodic peak current density in the range of about 5 to 150 milliamperes per square centimeter, a cathodic on-time in the range of about 0.05 to 10 milliseconds, an anodic peak current density in the range of about 0 to 30 milliamperes per square centimeter, an anodic on-time in the range of about 0.05 to 10 milliseconds The present invention will be illustrated by the following examples, which are intended to be illustrative and not limiting.

In all of the examples, the experiments were conducted in a rotating disk electrode system which included a coupon holder (cathode), pure tin (99.99%) anode to maintain the tin ion concentration in the electrolyte during the experiment, rotation speed controller, tank with 3 liter capacity, and rectifier to adjust the waveform parameters. Two polished copper substrates, 2 centimeters×2 centimeters×1.5 millimeters and 2.5 centimeters×2.5 centimeters×1.5 millimeters, were prepared for tin electroplating. Two coupon sizes were used to enable the variety of tests to be run on the tin deposit to fully evaluate the deposit structure and stress analysis. While the invention is illustrated using tin electroplating, similar conditions are useful in depositing tin alloys not limited to but including tin-copper, tin-bismuth, and tin-silver as well as tin-copper-silver.

Prior to tin electroplating, the coupons were immersed in cleaning and etching solutions to remove any contaminants and fingerprints from the surface, to obtain a similar surface roughness as a plated copper surface, and remove any existing oxide film. The coupons were rinsed with deionized water before electroplating.

Figure 2:
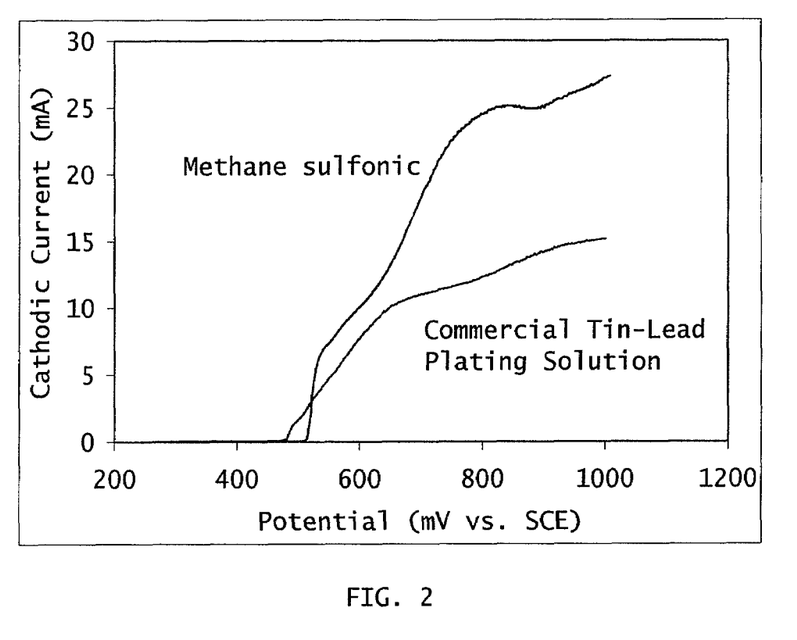
FIG. 2 is a graph showing the polarization curves for tin deposition in methane sulfonic acid solution and in a commercial tin-lead plating solution.

Pure tin was electroplated on the copper substrates from an electrolyte of 240 milliliters of methane sulfonic acid per liter, stannous sulfonate at a concentration corresponding to, approximately 37 of tin grams per liter, and approximately 1000 grams per liter of Triton X-100®. This electroplating bath is devoid of difficult-to-control additives and is easy to maintain. Methane sulfonic acid was selected because it is less corrosive than stannous fluoroborate and sulfate solutions, less susceptible to Sn(II) to Sn(IV) conversion, environmentally friendly, and less costly for effluent treatment and disposal. The polarization curves shown in FIG. 2 indicate that a higher tin deposition rate can be achieved when depositing from the methane sulfonic acid bath because the limiting current value in this solution is higher than in the commercial tin-lead bath. Both the tin-lead plating bath and the experimental methane sulfonic acid plating bath yielded a similar matte surface appearance. In addition, results of electron diffraction spectroscopy measurements indicated that no organic inclusions, e.g. carbon or sulfur, or other impurities that are usually associated with poor solderability and reflowability characteristics, were present in the tin deposits plated from the methane sulfonic acid bath.

Tin was plated on the exposed area of the copper coupon at 34±1 degrees Celsius to a thickness of 10 micrometers. The test duration was controlled by the applied cathodic charge to evaluate the current efficiency.

Four direct current electrodeposition experiments, eight pulse current electrodeposition experiments and eight pulse reverse current electrodeposition experiments were performed, and the parameters are described in Table 1. The results of the experiments are described in Table 2.

Example 1

Test D1

In the first test (D1), the rotation speed was 100 revolutions per minute and the average current density was 10 milliamperes per square centimeter. The following deposit properties were measured: 1) the surface appearance was a matte finish, 2) the process efficiency was 87 percent, 3) the average plating rate was 0.50 micrometers per minute, 4) the surface roughness 2 weeks after plating was 1.93 micrometers, 5) the surface roughness 6 weeks after plating was 2.28 micrometers, 6) the coverage of the tin deposit was not 100 percent of the total area, 7) the percentage of grains in the size range of 1 to 8 micrometers was 92.1 percent, 8) the full width half maximum (FWHM) of the x-ray diffraction curve data in the (420) plane was 0.090, 9) the full width half maximum (FWHM) of the x-ray diffraction curve data in the (411) plane was 0.091, 10) the internal stress was a compressive stress with a magnitude of 22 megapascals, and 11) after 2 and 6 weeks, no whisker growth was observed.

Example 2

Test D2

In the second test (D2), the rotation speed was 400 revolutions per minute and the average current density was 10 milliamperes per square centimeter. The following deposit properties were measured: 1) the surface appearance was a matte finish, 2) the process efficiency was 96 percent, 3) the average plating rate was 0.68 micrometers per minute, 4) the surface roughness 2 weeks after plating was 1.54 micrometers, 5) the surface roughness 6 weeks after plating was 2.08 micrometers, 6) the coverage of the tin deposit was not 100 percent of the total area, 7) the percentage of grains in the size range of 1 to 8 micrometers was 66.2 percent, 8) the full width half maximum (FWHM) of the x-ray diffraction curve data in the (420) plane was 0.088, 9) the full width half maximum (FWHM) of the x-ray diffraction curve data in the (411) plane was 0.096, 10) there was no internal stress (zero stress), and 11) after 2 and 6 weeks, no whisker growth was observed.

Example 3

Test D3

In the third test (D3), the rotation speed was 400 revolutions per minute and the average current density was 20 milliamperes per square centimeter. The following deposit properties were measured: 1) the surface appearance was a matte finish, 2) the process efficiency was 90 percent, 3) the average plating rate was 0.95 micrometers per minute, 4) the surface roughness 2 weeks after plating was 1.58 micrometers, 5) the surface roughness 6 weeks after plating was 1.14 micrometers, 6) the coverage of the tin deposit was not 100 percent of the total area, 7) the percentage of grains in the size range of 1 to 8 micrometers was 89.1 percent, 8) the full width half maximum (FWHM) of the x-ray diffraction curve data in the (420) plane was 0.084, 9) the full width half maximum (FWHM) of the x-ray diffraction curve data in the (411) plane was 0.083, 10) the internal stress was a compressive stress with a magnitude of 15.9 megapascals, and 11) after 2 and 6 weeks, no whisker growth was observed.

Example 4

Test D4

In the fourth test (D4), the rotation speed was 100 revolutions per minute and the average current density was 20 milliamperes per square centimeter. The following deposit properties were measured: 1) the surface appearance was a matte finish, 2) the process efficiency was 92 percent, 3) the average plating rate was 0.99 micrometers per minute, 4) the surface roughness 2 weeks after plating was 0.67 micrometers, 5) the surface roughness 6 weeks after plating was 0.67 micrometers, 6) the coverage of the tin deposit was 100 percent of the total area, 7) the percentage of grains in the size range of 1 to 8 micrometers was 93.4 percent, 8) the full width half maximum (FWHM) of the x-ray diffraction curve data in the (420) plane was 0.080, 9) the full width half maximum (FWHM) of the x-ray diffraction curve data in the (411) plane was 0.083, 10) the internal stress was a compressive stress with a magnitude of 9.5 megapascals, and 11) after 2 and 6 weeks, no whisker growth was observed.

The results of tests D1 to D4 have shown that the use of direct current electrodeposition results in a tin deposit with high compressive internal stresses and/or a grain size which is unacceptable by industry standards in that these parameters are believed to promote whisker formation during the electronic components lifetime.

Example 5

Test P5

In this example, the rotation speed was 400 revolutions per minute, the cathodic peak current density was 12.8 milliamperes per square centimeter, the cathodic on-time was 1 millisecond (the cathodic duty cycle was 80 percent), the off-time was 0.25 milliseconds (the off-time duty cycle was 20 percent), the frequency was 800 hertz, and the average current density was 10.2 milliamperes per square centimeter.

The following deposit properties were measured: 1) the surface appearance was a matte finish, 2) the process efficiency was 99 percent, 3) the average plating rate was 0.46 micrometers per minute, 4) the surface roughness 2 weeks after plating was 1.52 micrometers, 5) the surface roughness 6 weeks after plating was 1.49 micrometers, 6 the tin deposit did not completely cover the substrate 7) the percentage of grains in the size range of 1 to 8 micrometers was 90 percent, 8) the full width half maximum (FWHM) of the x-ray diffraction curve data in the (420) plane was 0.092, 9) the full width half maximum (FWHM) of the x-ray diffraction curve data in the (411) plane was 0.095, 10) the internal stress was a compressive stress with a magnitude of 3.2 megapascals, and 11) after 2 and 6 weeks, no whisker growth was observed.

Example 6

Test P6

In this example, the rotation speed was 100 revolutions per minute, the cathodic peak current density was 12.8 milliamperes per square centimeter, the cathodic on-time was 8 milliseconds (the cathodic duty cycle was 80 percent), the off-time was 2 milliseconds (the offtime duty cycle was 20 percent), the frequency was 100 hertz, and the average current density was 10.2 milliamperes per square centimeter.

The following deposit properties were measured: 1) the surface appearance was a matte finish, 2) the process efficiency was 99 percent, 3) the average plating rate was 0.64 micrometers per minute, 4) the surface roughness 2 weeks after plating was 2.05 micrometers, 5) the surface roughness 6 weeks after plating was 2.44 micrometers, 6) the coverage of the tin deposit was 100 percent of the total area, 7) the percentage of grains in the size range of 1 to 8 micrometers was 93.8 percent, 8) the full width half maximum (FWHM) of the x-ray diffraction curve data in the (420) plane was 0.096, 9) the full width half maximum (FWHM) of the x-ray diffraction curve data in the (411) plane was 0.099, 10) the internal stress was a compressive stress with a magnitude of 9.5 megapascals, and 11) after 2 and 6 weeks, no whisker growth was observed.

Example 7

Test P7

In this example, the rotation speed was 400 revolutions per minute, the cathodic peak current density was 25 milliamperes per square centimeter, the cathodic on-time was 8 milliseconds (the cathodic duty cycle was 80 percent), the off-time was 2 milliseconds (the offtime duty cycle was 20 percent), the frequency was 100 hertz, and the average current density was 20 milliamperes per square centimeter.

The following deposit properties were measured: 1) the surface appearance was a matte finish, 2) the process efficiency was 92 percent, 3) the average plating rate was 0.92 micrometers per minute, 4) the surface roughness 2 weeks after plating was 1.29 micrometers, 5) the surface roughness 6 weeks after plating was 2.3 micrometers, 6) the coverage of the tin deposit was not 100 percent of the total area, 7) the percentage of grains in the size range of 1 to 8 micrometers was 72.4 percent, 8) the full width half maximum (FWHM) of the x-ray diffraction curve data in the (420) plane was 0.107, 9) the full width half maximum (FWHM) of the x-ray diffraction curve data in the (411) plane was 0.109, 10) the internal stress was a tensile stress with a magnitude of 19.1 megapascals, and 11) after 2 and 6 weeks, no whisker growth was observed.

Example 8

Test P8

In this example, the rotation speed was 100 revolutions per minute, the cathodic peak current density was 25 milliamperes per square centimeter, the cathodic on-time was 1 millisecond (the cathodic duty cycle was 80 percent), the offtime was 0.25 milliseconds (the offtime duty cycle was 20 percent), the frequency was 800 hertz, and the average current density was 20 milliamperes per square centimeter.

The following deposit properties were measured: 1) the surface appearance was a matte finish, 2) the process efficiency was 100 percent, 3) the average plating rate was 0.88 micrometers per minute, 4) the surface roughness 2 weeks after plating was 0.96 micrometers, 5) the surface roughness 6 weeks after plating was 0.65 micrometers, 6) the coverage of the tin deposit was 100 percent of the total area, 7) the percentage of grains in the size range of 1 to 8 micrometers was 95.4 percent, 8) the full width half maximum (FWHM) of the x-ray diffraction curve data in the (420) plane was 0.089, 9) the full width half maximum (FWHM) of the x-ray diffraction curve data in the (411) plane was 0.086, 10) the internal stress was a tensile stress with a magnitude of 12.7 megapascals, and 11) after 2 and 6 weeks, no whisker growth was observed.

Example 9

Test P9

In this example, the rotation speed was 400 revolutions per minute, the cathodic peak current density was 33 milliamperes per square centimeter, the cathodic on-time was 0.375 milliseconds (the cathodic duty cycle was 30 percent), the offtime was 0.875 milliseconds (the offtime duty cycle was 70 percent), the frequency was 800 hertz, and the average current density was 9.9 milliamperes per square centimeter.

The following deposit properties were measured: 1) the surface appearance was a matte finish, 2) the process efficiency was 73 percent, 3) the average plating rate was 0.37 micrometers per minute, 4) the surface roughness 2 weeks after plating was 1.95 micrometers, 5) the surface roughness 6 weeks after plating was 3.21 micrometers, 6) the coverage of the tin deposit was not 100 percent of the total area, 7) the percentage of grains in the size range of 1 to 8 micrometers was 50 percent, 8) the full width half maximum (FWHM) of the x-ray diffraction curve data in the (420) plane was 0.089, 9) the full width half maximum (FWHM) of the x-ray diffraction curve data in the (411) plane was 0.089, 10) the internal stress was a tensile stress with a magnitude of 12.7 megapascals, and 11) after 2 and 6 weeks, no whisker growth was observed.

Example 10

Test P10

In this example, the rotation speed was 100 revolutions per minute, the cathodic peak current density was 33 milliamperes per square centimeter, the cathodic on-time was 3 milliseconds (the cathodic duty cycle was 30 percent), the offtime was 7 milliseconds (the offtime duty cycle was 70 percent), the frequency was 100 hertz, and the average current density was 9.9 milliamperes per square centimeter.

The following deposit properties were measured: 1) the surface appearance was a matte finish, 2) the process efficiency was 88 percent, 3) the average plating rate was 0.42 micrometers per minute, 4) the surface roughness 2 weeks after plating was 1.62 micrometers, 5) the surface roughness 6 weeks after plating was 1.19 micrometers, 6) the coverage of the tin deposit was 100 percent of the total area, 7) the percentage of grains in the size range of 1 to 8 micrometers was 92.8 percent, 8) the full width half maximum (FWHM) of the x-ray diffraction curve data in the (420) plane was 0.095, 9) the full width half maximum (FWHM) of the x-ray diffraction curve data in the (411) plane was 0.095, 10) the internal stress was a tensile stress with a magnitude of 15.9 megapascals, and 11) after 2 and 6 weeks, no whisker growth was observed.

Example 11

Test P11

In this example, the rotation speed was 400 revolutions per minute, the cathodic peak current density was 66 milliamperes per square centimeter, the cathodic on-time was 3 milliseconds (the cathodic duty cycle was 30 percent), the offtime was 7 milliseconds (the offtime duty cycle was 70 percent), the frequency was 100 hertz, and the average current density was 19.8 milliamperes per square centimeter.

The following deposit properties were measured: 1) the surface appearance was a matte finish, 2) the process efficiency was 88 percent, 3) the average plating rate was 0.86 micrometers per minute, 4) the surface roughness 2 weeks after plating was 1.16 micrometers, 5) the surface roughness 6 weeks after plating was 2.28 micrometers, 6) the coverage of the tin deposit was 100 percent of the total area, 7) the percentage of grains in the size range of 1 to 8 micrometers was 85.2 percent, 8) the full width half maximum (FWHM) of the x-ray diffraction curve data in the (420) plane was 0.092, 9) the full width half maximum (FWHM) of the x-ray diffraction curve data in the (411) plane was 0.091, 10) the internal stress was a compressive stress with a magnitude of 12.7 megapascals, and 11) after 2 and 6 weeks, no whisker growth was observed.

Example 12

Test P12

In this example, the rotation speed was 100 revolutions per minute, the cathodic peak current density was 66 milliamperes per square centimeter, the cathodic on-time was 0.375 milliseconds (the cathodic duty cycle was 30 percent), the offtime was 0.875 milliseconds (the offtime duty cycle was 70 percent), the frequency was 800 hertz, and the average current density was 19.8 milliamperes per square centimeter.

The following deposit properties were measured: 1) the surface appearance was a matte finish, 2) the process efficiency was 88 percent, 3) the average plating rate was 0.84 micrometers per minute, 4) the surface roughness 2 weeks after plating was 0.77 micrometers, 5) the surface roughness 6 weeks after plating was 0.62 micrometers, 6) the coverage of the tin deposit was 100 percent of the total area, 7) the percentage of grains in the size range of 1 to 8 micrometers was 83.9 percent, 8) the full width half maximum (FWHM) of the x-ray diffraction curve data in the (420) plane was 0.086, 9) the full width half maximum (FWHM) of the x-ray diffraction curve data in the (411) plane was 0.090, 10) the internal stress was a compressive stress with a magnitude of 3.2 megapascals, and 11) after 2 and 6 weeks, no whisker growth was observed.

Example 13

Test PR13

In this example, the rotation speed was 400 revolutions per minute, the cathodic peak current density was 29 milliamperes per square centimeter, the cathodic on-time was 1 millisecond (the cathodic duty cycle was 80 percent), the anodic peak current density was 14.5 milliamperes per square centimeter, the anodic on-time was 0.25 milliseconds (the anodic duty cycle was 20 percent), the frequency was 800 hertz, and the average current density was 20.3 milliamperes per square centimeter.

The following deposit properties were measured: 1) the surface appearance was a matte finish, 2) the process efficiency was 92 percent, 3) the average plating rate was 0.90 micrometers per minute, 4) the surface roughness 2 weeks after plating was 1.01 micrometers, 5) the surface roughness 6 weeks after plating was 1.11 micrometers, 6) the coverage of the tin deposit was not 100 percent of the total area, 7) the percentage of grains in the size range of 1 to 8 micrometers was 96.7 percent, 8) the full width half maximum (FWHM) of the x-ray diffraction curve data in the (420) plane was 0.082, 9) the full width half maximum (FWHM) of the x-ray diffraction curve data in the (411) plane was 0.081, 10) the internal stress was a compressive stress with a magnitude of 3.2 megapascals, and 11) after 2 and 6 weeks, no whisker growth was observed.

Example 14

Test PR14

In this example, the rotation speed was 400 revolutions per minute, the cathodic peak current density was 101 milliamperes per square centimeter, the cathodic on-time was 0.375 milliseconds (the cathodic duty cycle was 30 percent), the anodic peak current density was 14.5 milliamperes per square centimeter, the anodic on-time was 0.875 milliseconds (the anodic duty cycle was 70 percent), the frequency was 800 hertz, and the average current density was 20.2 milliamperes per square centimeter.

The following deposit properties were measured: 1) the surface appearance was a matte finish, 2) the process efficiency was 92 percent, 3) the average plating rate was 0.97 micrometers per minute, 4) the surface roughness 2 weeks after plating was 0.41 micrometers, 5) the surface roughness 6 weeks after plating was 0.64 micrometers, 6) the coverage of the tin deposit was 100 percent of the total area, 7) the percentage of grains in the size range of 1 to 8 micrometers was 93.4 percent, 8) the full width half maximum (FWHM) of the x-ray diffraction curve data in the (420) plane was 0.081, 9) the full width half maximum (FWHM) of the x-ray diffraction curve data in the (411) plane was 0.084, 10) the internal stress was a tensile stress with a magnitude of 15.9 megapascals, and 11) after 2 and 6 weeks, no whisker growth was observed.

Example 15

Test PR15

In this example, the rotation speed was 100 revolutions per minute, the cathodic peak current density was 29 milliamperes per square centimeter, the cathodic on-time was 8 milliseconds (the cathodic duty cycle was 80 percent), the anodic peak current density was 15 milliamperes per square centimeter, the anodic on-time was 2 milliseconds (the anodic duty cycle was 20 percent), the frequency was 100 hertz, and the average current density was 20.2 milliamperes per square centimeter.

The following deposit properties were measured: 1) the surface appearance was a matte finish, 2) the process efficiency was 100 percent, 3) the average plating rate was 1.21 micrometers per minute, 4) the surface roughness 2 weeks after plating was 1.25 micrometers, 5) the surface roughness 6 weeks after plating was 1.16 micrometers, 6) the coverage of the tin deposit was 100 percent of the total area, 7) the percentage of grains in the size range of 1 to 8 micrometers was 91 percent, 8) the full width half maximum (FWHM) of the x-ray diffraction curve data in the (420) plane was 0.071, 9) the full width half maximum (FWHM) of the x-ray diffraction curve data in the (411) plane was 0.079, 10) the internal stress was a tensile stress with a magnitude of 3.2 megapascals, and 11) after 2 and 6 weeks, no whisker growth was observed.

Example 16

Test PR16

In this example, the rotation speed was 100 revolutions per minute, the cathodic peak current density was 101 milliamperes per square centimeter, the cathodic on-time was 3 milliseconds (the cathodic duty cycle was 30 percent), the anodic peak current density was 15 milliamperes per square centimeter, the anodic on-time was 7 milliseconds (the anodic duty cycle was 70 percent), the frequency was 100 hertz, and the average current density was 19.8 milliamperes per square centimeter.

The following deposit properties were measured: 1) the surface appearance was a matte finish, 2) the process efficiency was 93 percent, 3) the average plating rate was 0.87 micrometers per minute, 4) the surface roughness 2 weeks after plating was 0.61 micrometers, 5) the surface roughness 6 weeks after plating was 0.69 micrometers, 6) the coverage of the tin deposit was 100 percent of the total area, 7) the percentage of grains in the size range of 1 to 8 micrometers was 86.4 percent, 8) the full width half maximum (FWHM) of the x-ray diffraction curve data in the (420) plane was 0.079, 9) the full width half maximum (FWHM) of the x-ray diffraction curve data in the (411) plane was 0.081, 10) the internal stress was a compressive stress with a magnitude of 12.7 megapascals, and 11) after 2 and 6 weeks, no whisker growth was observed.

Example 17

Test PR17

In this example, the rotation speed was 400 revolutions per minute, the cathodic peak current density was 49 milliamperes per square centimeter, the cathodic on-time was 3 milliseconds (the cathodic duty cycle was 30 percent), the anodic peak current density was 8 milliamperes per square centimeter, the anodic on-time was 7 milliseconds (the anodic duty cycle was 70 percent), the frequency was 100 hertz, and the average current density was 9.1 milliamperes per square centimeter.

The following deposit properties were measured: 1) the surface appearance was a matte finish, 2) the process efficiency was 85 percent, 3) the average plating rate was 0.37 micrometers per minute, 4) the surface roughness 2 weeks after plating was 0.94 micrometers, 5) the surface roughness 6 weeks after plating was 0.79 micrometers, 6) the coverage of the tin deposit was 100 percent of the total area, 7) the percentage of grains in the size range of 1 to 8 micrometers was 85.7 percent, 8) the full width half maximum (FWHM) of the x-ray diffraction curve data in the (420) plane was 0.091, 9) the full width half maximum (FWHM) of the x-ray diffraction curve data in the (411) plane was 0.087, 10) there was no internal stress (zero stress), and 11) after 2 and 6 weeks, no whisker growth was observed.

Example 18

Test PR18

In this example, the rotation speed was 100 revolutions per minute, the cathodic peak current density was 49 milliamperes per square centimeter, the cathodic on-time was 0.375 milliseconds (the cathodic duty cycle was 30 percent), the anodic peak current density was 8 milliamperes per square centimeter, the anodic on-time was 0.875 milliseconds (the anodic duty cycle was 70 percent), the frequency was 800 hertz, and the average current density was 9.1 milliamperes per square centimeter.

The following deposit properties were measured: 1) the surface appearance was a matte finish, 2) the process efficiency was 87 percent, 3) the average plating rate was 0.39 micrometers per minute, 4) the surface roughness 2 weeks after plating was 1.00 micrometers, 5) the surface roughness 6 weeks after plating was 0.66 micrometers, 6) the coverage of the tin deposit was not 100 percent of the total area, 7) the percentage of grains in the size range of 1 to 8 micrometers was 94.7 percent, 8) the full width half maximum (FWHM) of the x-ray diffraction curve data in the (420) plane was 0.082, 9) the full width half maximum (FWHM) of the x-ray diffraction curve data in the (411) plane was 0.074, 10) the internal stress was a compressive stress with a magnitude of 6.4 megapascals, and 11) after 2 and 6 weeks, no whisker growth was observed.

Example 19

Test PR19

In this example, the rotation speed was 100 revolutions per minute, the cathodic peak current density was 14.5 milliamperes per square centimeter, the cathodic on-time was 1 millisecond (the cathodic duty cycle was 80 percent), the anodic peak current density was 8 milliamperes per square centimeter, the anodic on-time was 0.25 milliseconds (the anodic duty cycle was 20 percent), the frequency was 800 hertz, and the average current density was 10 milliamperes per square centimeter.

The following deposit properties were measured: 1) the surface appearance was a matte finish, 2) the process efficiency was 100 percent, 3) the average plating rate was 0.48 micrometers per minute, 4) the surface roughness 2 weeks after plating was 1.03 micrometers, 5) the surface roughness 6 weeks after plating was 0.98 micrometers, 6) the coverage of the tin deposit was 100 percent of the total area, 7) the percentage of grains in the size range of 1 to 8 micrometers was 83.3 percent, 8) the full width half maximum (FWHM) of the x-ray diffraction curve data in the (420) plane was 0.078, 9) the full width half maximum (FWHM) of the x-ray diffraction curve data in the (411) plane was 0.077, 10) the internal stress was a tensile stress with a magnitude of 15.9 megapascals, and 11) after 2 and 6 weeks, no whisker growth was observed.

Example 20

Test PR20

In this example, the rotation speed was 400 revolutions per minute, the cathodic peak current density was 14.5 milliamperes per square centimeter, the cathodic on-time was 8 milliseconds (the cathodic duty cycle was 80 percent), the anodic peak current density was 8 milliamperes per square centimeter, the anodic on-time was 2 milliseconds (the anodic duty cycle was 20 percent), the frequency was 100 hertz, and the average current density was 10 milliamperes per square centimeter.

The following deposit properties were measured: 1) the surface appearance was a matte finish, 2) the process efficiency was 100 percent, 3) the average plating rate was 0.63 micrometers per minute, 4) the surface roughness 2 weeks after plating was 1.08 micrometers, 5) the surface roughness 6 weeks after plating was 0.97 micrometers, 6) the coverage of the tin deposit was 100 percent of the total area, 7) the percentage of grains in the size range of 1 to 8 micrometers was 76.6 percent, 8) the full width half maximum (FWHM) of the x-ray diffraction curve data in the (420) plane was 0.083, 9) the full width half maximum (FWHM) of the x-ray diffraction curve data in the (411) plane was 0.080, 10) the internal stress was a compressive stress with a magnitude of 12.7 megapascals, and 11) after 2 and 6 weeks, no whisker growth was observed.

Summary of Examples

The electrically mediated process parameters used in the experiments described in Examples 5 to 20 were designed using a factorial design method (MINITAB statistical software) to investigate the effects of the electrically mediated process parameters on the properties of the tin deposit. Factorial design allows for the simultaneous study of the effects that several factors may have on a process, and also allows for the study of interactions between the factors. Tables 1 and 2 summarize the electrically mediated process parameters and the results, respectively, for the tests described in Examples 5 to 20, and compares them with the results generated using direct current electrodeposition.

TABLE 1

Electrically mediated process parameters for each test.

| Test No. | Rotation rate (rpm) | Frequency (Hz) | iaverage (mA/cm$^2$) | ic, peak (mA/cm$^2$) | Cathodic on-time (ms) | ia, peak (mA/cm$^2$) | Anodic on-time or offtime (ms) |
|---|---|---|---|---|---|---|---|
| D1 | 100 | — | 10 | 10 | — | — | — |
| D2 | 400 | — | 10 | 10 | — | — | — |
| D3 | 400 | — | 20 | 20 | — | — | — |
| D4 | 100 | — | 20 | 20 | — | — | — |
| P5 | 400 | 800 | 10.2 | 12.8 | 1 | 0 | 0.25 |
| P6 | 100 | 100 | 10.2 | 12.8 | 8 | 0 | 2 |
| P7 | 400 | 100 | 20 | 25 | 8 | 0 | 2 |
| P8 | 100 | 800 | 20 | 25 | 1 | 0 | 0.25 |
| P9 | 400 | 800 | 9.9 | 33 | 0.375 | 0 | 0.875 |
| P10 | 100 | 100 | 9.9 | 33 | 3 | 0 | 7 |
| P11 | 400 | 100 | 19.8 | 66 | 3 | 0 | 7 |
| P12 | 100 | 800 | 19.8 | 66 | 0.375 | 0 | 0.875 |
| PR13 | 400 | 800 | 20.3 | 29 | 1 | 14.5 | 0.25 |
| PR14 | 400 | 800 | 20.2 | 101 | 0.375 | 14.5 | 0.875 |
| PR15 | 100 | 100 | 20.2 | 29 | 8 | 15 | 2 |
| PR16 | 100 | 100 | 19.8 | 101 | 3 | 15 | 7 |
| PR17 | 400 | 100 | 9.1 | 49 | 3 | 8 | 7 |
| PR18 | 100 | 800 | 9.1 | 49 | 0.375 | 8 | 0.875 |
| PR19 | 100 | 800 | 10 | 14.5 | 1 | 8 | 0.25 |
| PR20 | 400 | 100 | 10 | 14.5 | 8 | 8 | 2 |

TABLE 2

Summary of deposit properties for each test. In all cases, there were no whiskers after 2 or 6 weeks after deposition, and all the deposits had a matte finish.

| Test No. | C | η (%) | Surface roughness (μm), after 2 weeks | Surface roughness (μm), after 6 weeks | FWHM (420) | FWHM (411) | Deposition Rate (μm/min) | % 1-8 μm grains | Stress (MPa) |
|---|---|---|---|---|---|---|---|---|---|
| D1 | N | 87 | 1.93 | 2.28 | 0.09 | 0.091 | 0.50 | 92.1 | −22 |
| D2 | N | 96 | 1.54 | 2.08 | 0.088 | 0.096 | 0.68 | 66.2 | 0 |
| D3 | N | 90 | 1.58 | 1.14 | 0.084 | 0.083 | 0.95 | 89.1 | −15.9 |
| D4 | Y | 92 | 0.67 | 0.67 | 0.080 | 0.083 | 0.99 | 93.4 | −9.5 |
| P5 | N | 99 | 1.52 | 1.49 | 0.092 | 0.095 | 0.46 | 90.0 | −3.2 |
| P6 | Y | 99 | 2.05 | 2.44 | 0.096 | 0.099 | 0.64 | 93.8 | −9.5 |
| P7 | N | 92 | 1.29 | 2.3 | 0.107 | 0.109 | 0.92 | 72.4 | 19.1 |
| P8 | Y | 100 | 0.96 | 0.65 | 0.089 | 0.086 | 0.88 | 95.4 | 12.7 |
| P9 | N | 73 | 1.95 | 3.21 | 0.089 | 0.089 | 0.37 | 50.0 | 12.7 |
| P10 | Y | 88 | 1.62 | 1.19 | 0.095 | 0.095 | 0.42 | 92.8 | 15.9 |
| P11 | Y | 88 | 1.16 | 2.28 | 0.092 | 0.091 | 0.86 | 85.2 | −12.7 |
| P12 | Y | 88 | 0.77 | 0.62 | 0.086 | 0.09 | 0.84 | 83.9 | −3.2 |
| PR13 | N | 92 | 1.01 | 1.11 | 0.082 | 0.081 | 0.90 | 96.7 | −3.2 |
| PR14 | Y | 92 | 0.41 | 0.64 | 0.081 | 0.084 | 0.97 | 93.4 | 15.9 |
| PR15 | Y | 100 | 1.25 | 1.16 | 0.071 | 0.079 | 1.21 | 91.0 | 3.2 |
| PR16 | Y | 93 | 0.61 | 0.69 | 0.079 | 0.081 | 0.87 | 86.4 | −12.7 |
| PR17 | Y | 85 | 0.94 | 0.79 | 0.091 | 0.087 | 0.37 | 85.7 | 0 |
| PR18 | N | 87 | 1.00 | 0.66 | 0.082 | 0.074 | 0.39 | 94.7 | −6.4 |
| PR19 | Y | 100 | 1.03 | 0.98 | 0.078 | 0.077 | 0.48 | 83.3 | 15.9 |
| PR20 | Y | 100 | 1.08 | 0.97 | 0.083 | 0.08 | 0.63 | 76.6 | −12.7 |

"C" = coverage-
Y means 100% coverage,
N means less than 100% coverage;
η = efficiency;
FWHM = Full Width Half Maximum in the 411 or 420 planes.

Figure 3:
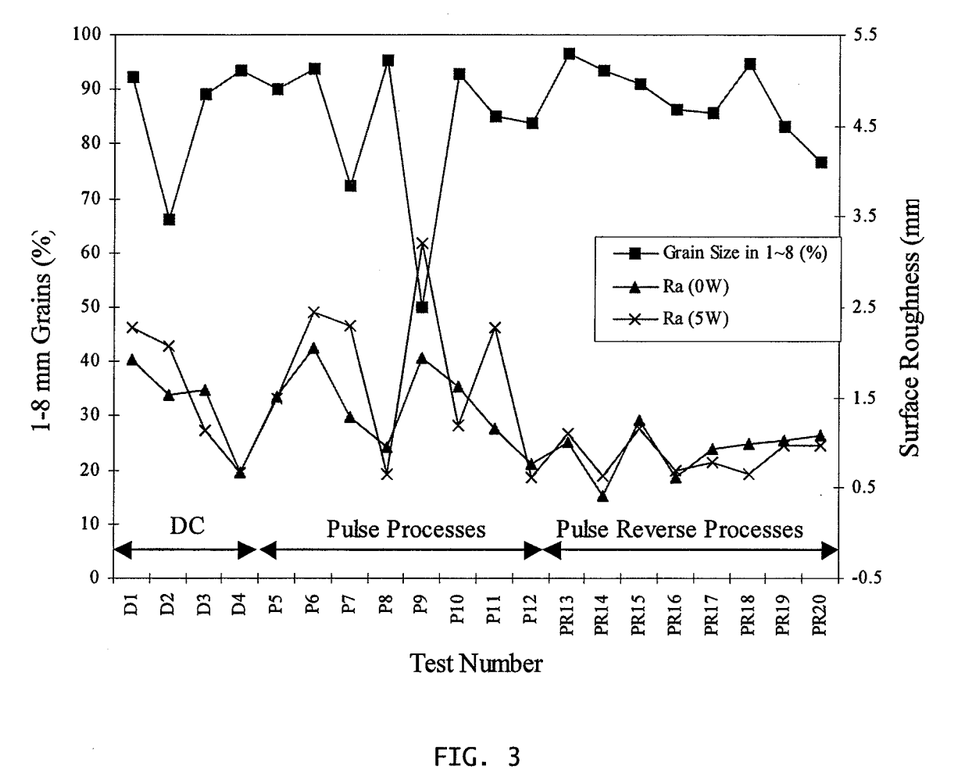
FIG. 3 is a graph showing the grain size and surface roughness of a tin deposit produced by the method of the present invention, as a function of changing process parameters. The surface roughness is measured in terms of Ra, which is the arithmetic mean deviation of the profile. The profile identified (OW), is a measure of the surface as initially plated. The profile identified (5 W) is a measure of the surface after five weeks of exposure to ambient conditions.
Figure 5:
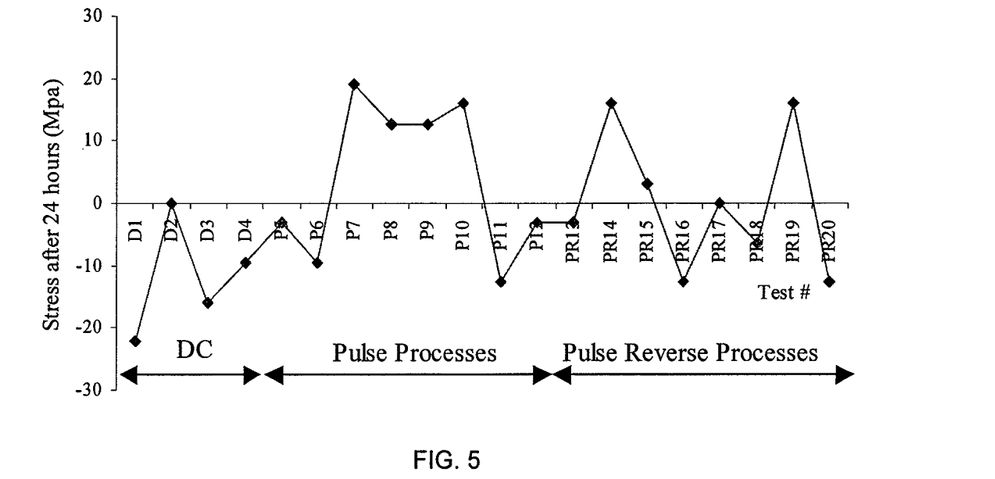
FIG. 5 is a graph showing the internal stress in the tin deposit, as a function of changing process parameters.

FIG. 3 shows the percentage of 1 to 8 micrometer grains obtained using the electrically mediated process as compared to the direct current process. These results indicate that the electrically mediated process can control the grain size in the desired range of 1 to 8 micrometers. Although the direct current process demonstrated the ability to control the grain size in most cases, the high surface roughness (FIG. 3) and the high compressive stresses in the deposits (FIG. 5) make the direct current process results unacceptable. The electrically mediated process displayed the ability to control the grain size and uniformity while providing varying types of stress, depending on which pulse reverse waveform was applied (FIGS. 3 and 5). When high current density, high frequency and a reversed waveform are employed, the surface grain size decreases, the number of grains increases and the grains appear to become more uniform. Also, the grain structure (or shape) tends to change with grain size. Generally, the larger grains (greater than 10 micrometers) tend to have an irregular or columnar structure, whereas the smaller grains have a more polygonized grain structure.

Figure 4:
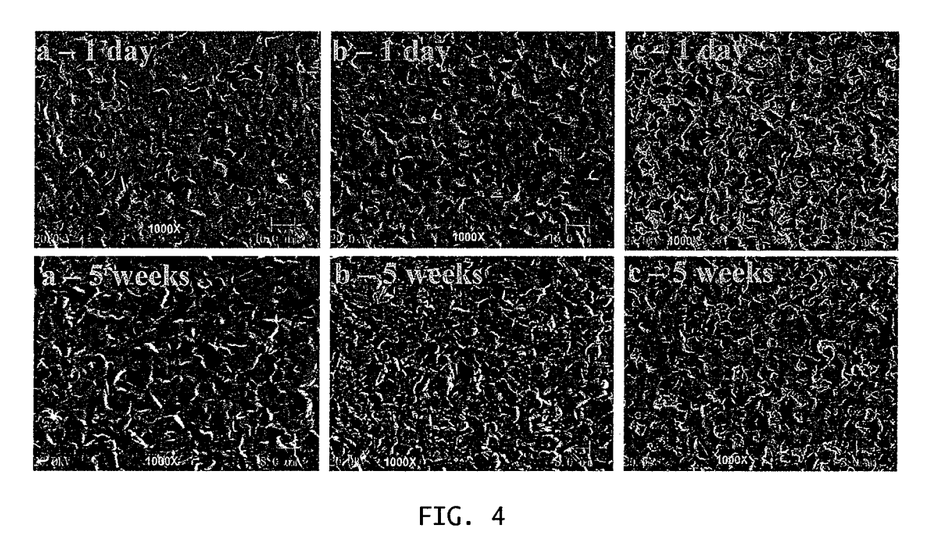
FIG. 4 is a series of scanning electron micrographs showing the change in surface morphology of the tin deposit after one day after and 5 weeks after plating under conditions of a) test D4, b) test P8, and c) test PR16.

The effect of the electrically mediated parameters on grain structure and grain size and uniformity correlates with the surface roughness of the tin deposits. As shown in FIG. 3, a tin deposit with a smoother surface (lower surface roughness) generally has a higher number of grains in the desired size range (1 to 8 micrometers) with a narrow size distribution. The probability of the tin deposit surface roughness to change with storage time strongly depends upon the preliminary grain size distribution, which can be controlled with the electrically mediated process parameters. Scanning electron microscopy pictures (FIG. 4) of the morphology of tin deposit surfaces that initially had low surface roughness show the transformation of grain structure and grain size and uniformity rely upon the deposition process parameters. The grain size increases significantly with storage time when using a direct current electrodeposition process (FIG. 4a). The grain growth within the deposit, which rearranges atoms, could reduce the tensile stress that is reported to reduce the propensity of whisker formation and growth. When utilizing a pulse or pulse reverse waveform in the electrically mediated process, the tin deposit surface displays a nearly stable grain structure associated with lower and relatively constant surface roughness, regardless of the storage time (FIGS. 4b & 4c).

Examples 5 to 20 show that by using the electrically mediated process the internal stresses in the tin deposit can be varied to form either compressive, tensile or zero stress on the different crystal planes of the tin deposit. FIG. 5 shows that the direct current plating processes generally produced compressive internal stresses in the tin deposit, whereas the electrically mediated process can be tuned to yield either low compressive or tensile stress, as well as a zero stress deposit. It should be noted that although the second direct current test (D2) produced a tin deposit with zero stress (FIG. 5), it contained a low percentage of grains in the desired 1 to 8 micrometer size range and the surface roughness increased as the sample was aged (FIG. 3), making this result undesirable. The results of the stress level test (defined by the absolute value of stress, i.e., regardless of stress type) reveal that direct current plating generates high internal stresses. However, the electrically mediated process can reduce the internal stress, especially when using pulse reverse waveform parameters. While the theory of controlling internal stress using pulse-reverse is not understood, the capability to control internal stress of tin-alloy deposits using pulse-reverse technology provides a technique of generating whisker-free tin deposits. Additionally, the statistical analysis indicates that the effect of the electrically mediated parameters e.g. waveform type, frequency, and cathodic duty cycle, on stress generation is larger than the effect of solution hydrodynamics at the electrode/solution interface.

X-ray diffraction (XRD) results were used to examine the correlation between the electrically mediated process and the potential for whisker growth by determining the internal stress of the tin deposits. Internal stress of the tin deposit was derived by calculating the strain from the shift of the diffraction lines from the original 2θ value of an unstrained sample to a new 2θ value of the strained sample. Tensile stresses and compressive stresses are reported as positive and negative values respectively. This sign convention results from the direction of the shift to lower or higher 2θ values for compressive or tensile stresses respectively. Once the strain value is known, the macrostress or uniform stress is calculated using the elastic constants of the material. The resulting macrostresses for each test are quantified in column 10 of Table 2. Additionally, the full width half measurement (FWHM) values of the x-ray curve data illustrated the effect of strain on the direction of X-ray reflection and was used to assess stress in the tin deposit. Non-uniform stress or microstress causes a broadening of diffraction lines. A larger value of FWHM corresponds to an increase in the non-uniformity of the stress in the deposit. The uniformity of the stress in the deposit is believed to influence the stress development responsible for spontaneous whisker growth in the tin deposit. The values of the FWHM in Table 2 indicate that the use of forward only electrically mediated waveforms resulted in tin deposits with a more nonuniform stress when compared to tin deposits plated using direct current or electrically mediated waveforms with both forward and reverse pulses. The tin deposits with a low percentage of desired grains consisted of more irregularly shaped grains that caused higher or nonuniform stress.

Figure 6:
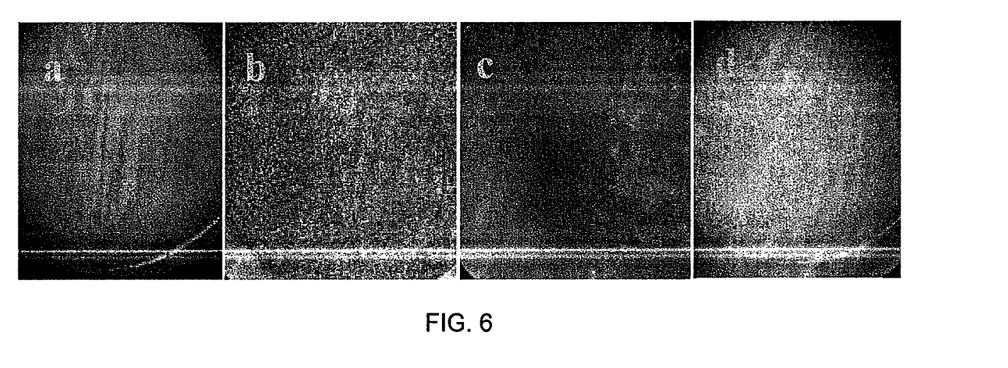
FIG. 6 is a series of optical micrographs showing the surface appearance of the tin deposit after plating from a tin-methane sulfonic acid plating bath (a, b), and a commercial tin-lead plating bath (c, d).

As shown in FIG. 6, the surface appearance of the tin deposit that was obtained from our experimental solution has a similar matte finish when compared with the tin deposit plated from a commercial matte tin-lead plating solution. Also, it is important to note that the surface appearance can change with storage time if an uneven tin oxide layer forms on the surface. The different colors that appeared after several weeks on the tin deposit surfaces of the direct current plated sample (FIG. 6b) was due to uneven surface oxidation. In contrast, after several weeks of observations, the surface appearance of the tin deposit from the electrically mediated process remained unchanged (FIG. 6d) due to a more uniform surface oxide layer. Though the surface oxide layer does not induce stress in the tin layer, it is a natural and important part of the structure. It has been hypothesized to act as a physical barrier that prevents whiskers from penetrating through the surface. Optimization of the tin oxide layer properties (e.g. thickness and uniformity) would be beneficial in deterring whisker growth. The electrically mediated process can build up a uniform oxide film on the deposit surface by using the appropriate pulse reverse waveform parameters.

Notes

Osterman, M. (2002), Mitigation Strategies for Tin Whiskers, http://www.calce.umd.edu/lead-free/tin-whiskers/TIN-WHISKERMITIGATION.pdf (May 20th, 2003). Jordan, M. (2003), Lead-Free Tin Alloys, *Metal Finishing*, 101, 1, pp 8-16. Zhang, Y. and J. A. Abys (1996), An Alternative Surface Finish for Tin/Lead Solders—Pure Tin, *Proc. SURFIN/'96*, AESF, pp 223-246. Hilty, R. D. (2003), Lead-free Platings for Connector Contacts, *Connector Specifier*, November. Knodler, A. (1986), *Theory and Practice of Pulse Plating*, AESF, Orlando, Fla., pp 119-175. Huang, C.-H., Shu, W.-Y., Wu, H.-M. and Lee, C.-H. (2004), Pulsed Deposition of Ultra-Thin Copper Foils, *Plating and Surface Finishing*, September, pp 34-38. Abys, J. A., K. J. Murski and Y. Zhang, Electroplating Solution for Electroplating Lead and Lead/Tin Alloys, U.S. Pat. No. 6,267,863 issued Jul. 31, 2001. Chiu, S. H. and Y. Zhang, Tin Electroplating Bath, U.S. Pat. No. 6,342,148 issued Jan. 29, 2002. Zhang, Y. Tin Electroplating Process, U.S. Pat. No. 5,750,017 issued May 12, 1998. Schetty, R. (2003), Tin Whisker Studies—Experimentation & Mechanistic Understanding, *Plating and Surface Finishing*, 90, 3, pp 48-51. B. Z. Lee and D. N. Lee, (1998) "Spontaneous Growth Mechanism of Tin Whisker" Acta Mater., Vol. 46.

The invention having now been fully described, it should be understood that it might be embodied in other specific forms or variations without departing from its spirit or essential characteristics. Accordingly, the embodiments described above are to be considered in all respects as illustrative and not restrictive, the scope of the invention being indicated by the appended claims rather than the foregoing description, and all changes which come within the meaning and range of equivalency of the claims are intended to be embraced therein.

What is claimed is:

1. A method for electrochemically plating tin or tin alloy onto a workpiece, comprising:
   immersing the workpiece in an electroplating bath comprising stannous ions and devoid of organic additives other than alkane sulfonic acid and a wetting agent;
   immersing a counter electrode in said electroplating bath; and
   passing a succession of mediated pulsed currents between said workpiece and said counter electrode sufficient to provide a tin or tin alloy deposit on said workpiece, the pulsed current having a cathodic peak currents density in the range of about 5 to 150 milliamperes per square centimeter, a cathodic on-time in the range of about 0.05 to 10 milliseconds, an anodic peak current density in the range of greater than 0 to about 30 milliamperes per square centimeter, an anodic on-time in the range of about 0.05 to 10 milliseconds, wherein said deposit has an outer surface and an interface between the workpiece and the deposit and, wherein the pulsed currents are mediated such that the deposit has a stress gradient from the interface between said workpiece and said deposit to the outer surface of said deposit; the stress gradient being within the deposit.

2. A method for electrochemically plating a metal or a metal alloy onto a conducting workpiece using a cell comprising:
   a. immersing said workpiece in an electrolyte solution devoid of organic additives other than alkane sulfonic acid and a wetting agent;
   b. immersing a counterelectrode in said electrolyte solution; and
   c. passing a succession of mediated pulsed currents between said workpiece and said counter electrode sufficient to generate a deposit of metal or metal alloy onto said workpiece, the pulsed currents having a cathodic peak current density in the range of about 5 to 150 milliamperes per square centimeter, a cathodic on-time in the range of about 0.05 to 10 milliseconds, an anodic peak current density in the range of greater than 0 to about 30 milliamperes per square centimeter, an anodic on-time in the range of about 0.05 to 10 milliseconds, wherein said pulsed currents are mediated such that the deposit has a predetermined stress gradient selected from the group consisting of a stress gradient from zero stress at said interface and compressive stress at said outer surface; a stress gradient from zero stress at said interface and tensile stress at said outer surface; a stress gradient from compressive stress at said interface and zero stress at said outer surface; a stress gradient from compressive stress at said interface and tensile stress at said outer surface; a stress gradient from tensile stress at said interface and compressive stress at said outer surface; and the stress gradient being within the deposit.

3. The method as described in claim 2 wherein said metal and metal alloy comprise tin and tin alloy.

4. The method as described in claim 1 wherein said workpiece comprises a copper substrate.

5. The method as described in claim 1 wherein said workpiece is a cathode.

6. The method as described in claim 1 wherein said electroplating bath consists essentially of an alkane sulfonic acid, a wetting agent, and a stannous sulfonate.

7. The method as described in claim 2 wherein said alkane sulfonic acid is alkane sulfonic acid, said wetting agent is Triton X-100, and said solution further includes stannous methane sulfonate.

8. The method as described in claim 1 wherein said pulsed currents includes a succession of alternating cathodic on-times and anodic on-times.

9. The method as described in claim 1 wherein said pulsed currents are pulse-pulse reverse currents.

10. A method for electrochemically plating a metal or a metal alloy onto a conducting workpiece using a cell comprising:
   a. immersing a counter electrode in an electrolyte solution devoid of organic additives other than alkane sulfonic acid and a wetting agent;
   b. immersing said workpiece in said electrolyte solution; and
   c. passing a succession of mediated pulsed currents between said workpiece and said counter electrode sufficient to generate a deposit of metal or metal alloy onto said substrate, the pulsed currents having a cathodic peak current density in the range of about 5 to 150 milliamperes per square centimeter, a cathodic on-time in the range of about 0.05 to 10 milliseconds, an anodic peak current density in the range of greater than 0 to about 30 milliamperes per square centimeter, an anodic on-time in the range of about 0.05 to 10 milliseconds, wherein said deposit has an outer surface and an interface between the workpiece and the deposit; and wherein the pulsed currents are mediated such that deposit has a stress gradient from the interface between said workpiece and said deposit to the outer surface of said deposit selected from the group consisting of a stress gradient from zero stress at said interface and compressive stress at said outer surface; a stress gradient from zero stress at said interface and tensile stress at said outer surface; a stress gradient from compressive stress at said interface and zero stress at said outer surface; a stress gradient from compressive stress at said interface and tensile stress at said outer surface; a stress gradient from tensile stress at said interface and compressive stress at said outer surface; and the stress gradient being within the deposit.

11. The method as described in claim 10 wherein said metal and metal alloy comprise tin and tin alloy.

12. The method as described in claim 10 wherein said counter electrode is a tin electrode.

13. The method as described in claim 10 wherein said workpiece comprises a copper substrate.

14. The method as described in claim 10 wherein said workpiece comprises a cathode in said cell.

15. The method as described in claim 10 wherein said electrolyte solution consists essentially of said acid, said wetting agent, and a salt of said metal.

16. The method as described in claim 10 wherein said electrolyte solution consists essentially of an alkane sulfonic acid, a wetting agent, and a stannous sulfonate.

17. The method as described in claim 15 wherein said alkane sulfonic acid is alkane sulfonic acid, said wetting agent is Triton X-100, and said stannous sulfonate is stannous methane sulfonate.

18. The method as described in claim 10 wherein said solution is devoid of additives containing heterocyclic moiety.

19. The method as described in claim 10 wherein said pulsed currents consists of a succession of alternating cathodic on-times and anodic on-times.

20. The method as described in claim 10 wherein said pulsed currents are pulse-pulse reverse currents.

21. The method as described in claim 1 wherein said stress gradient is selected from the group consisting of: a stress gradient from zero stress at said interface and compressive stress at said outer surface; a stress gradient from zero stress at said interface and tensile stress at said outer surface; a stress gradient from compressive stress at said interface and zero stress at said outer surface; a stress gradient from compressive stress at said interface and tensile stress at said outer surface; a stress gradient from tensile stress at said interface and compressive stress at said outer surface.

22. The method as described in claim 21 wherein said bath is devoid of additives containing heterocyclic moiety.

23. The method of claim 1 wherein said stress gradient includes a compressive stress.

24. The method of claim 10 wherein said stress gradient includes a compressive stress.

25. The method of claim 1 wherein the tin or tin alloy deposit has a grain size in the range of 1 to 8 micrometers provided that no more than 30% of the grains have a grain size outside of said range but the average grain size is within said range.

26. The method of claim 2 wherein the tin or tin alloy deposit has a grain size in the range of 1 to 8 micrometers provided that no more than 30% of the grains have a grain size outside of said range but the average grain size is within said range.

27. The method of claim 10 wherein the tin or tin alloy deposit has a grain size in the range of 1 to 8 micrometers provided that no more than 30% of the grains have a grain size outside of said range but the average grain size is within said range.

* * * * *

UNITED STATES PATENT AND TRADEMARK OFFICE
CERTIFICATE OF CORRECTION

Page 1 of 1

PATENT NO. : 8,603,315 B2
APPLICATION NO. : 11/620079
DATED : December 10, 2013
INVENTOR(S) : Taylor et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 257 days.

Signed and Sealed this
Seventh Day of April, 2015

Michelle K. Lee
*Director of the United States Patent and Trademark Office*